United States Patent
Kim et al.

(10) Patent No.: US 8,000,676 B2
(45) Date of Patent: Aug. 16, 2011

(54) SECOND INTERCEPT POINT (IP2) CALIBRATOR AND METHOD FOR CALIBRATING IP2

(75) Inventors: Hyun-Seok Kim, Gwacheon-si (KR); Woo-Nyun Kim, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 938 days.

(21) Appl. No.: 11/942,875

(22) Filed: Nov. 20, 2007

(65) Prior Publication Data

US 2008/0116902 A1    May 22, 2008

(30) Foreign Application Priority Data

Nov. 22, 2006  (KR) .................. 10-2006-0116009

(51) Int. Cl.
*H04B 1/26* (2006.01)
(52) U.S. Cl. ........ 455/323; 455/333; 455/305; 455/311; 455/298
(58) Field of Classification Search ........... 455/296–333
See application file for complete search history.

(56) References Cited

U.S. PATENT DOCUMENTS

| | | | | |
|---|---|---|---|---|
| 6,006,081 A * | 12/1999 | Moore | ............ | 455/326 |
| 6,021,323 A * | 2/2000 | Vagher | ............ | 455/324 |
| 6,316,996 B1 * | 11/2001 | Puotiniemi | ............ | 330/254 |
| 6,865,382 B2 * | 3/2005 | Behzad | ............ | 455/323 |
| 7,259,569 B2 * | 8/2007 | Kim | ............ | 324/601 |
| 7,263,344 B2 * | 8/2007 | Manku | ............ | 455/323 |
| 7,356,317 B2 * | 4/2008 | Xu et al. | ............ | 455/130 |
| 7,421,260 B2 * | 9/2008 | Darabi | ............ | 455/130 |
| 7,421,263 B2 * | 9/2008 | Kim | ............ | 455/234.1 |
| 7,489,916 B1 * | 2/2009 | Farias et al. | ............ | 455/315 |
| 7,542,737 B2 * | 6/2009 | Pousset et al. | ............ | 455/114.2 |
| 7,689,194 B2 * | 3/2010 | Kivekas et al. | ............ | 455/313 |
| 7,738,852 B2 * | 6/2010 | Lin et al. | ............ | 455/326 |
| 7,796,968 B2 * | 9/2010 | Hwang et al. | ............ | 455/326 |
| 7,817,998 B1 * | 10/2010 | Tse et al. | ............ | 455/423 |
| 2003/0129958 A1 * | 7/2003 | Behzad | ............ | 455/326 |
| 2006/0145706 A1 * | 7/2006 | Kim | ............ | 324/601 |
| 2006/0148438 A1 * | 7/2006 | Manku | ............ | 455/313 |

FOREIGN PATENT DOCUMENTS

| | | |
|---|---|---|
| KR | 1020050065124 | 6/2005 |
| KR | 519876 | 8/2005 |
| KR | 1020060080387 | 7/2006 |

OTHER PUBLICATIONS

"A Direct Conversion Receiver With an IP2 Calibrator for CDMA/PCS/GPS/AMPS Applications", Woonyun Kim et al., IEEE Journal of Solid-State Circuits, vol. 41, No. 7, Jul. 2006.

* cited by examiner

*Primary Examiner* — Edward Urban
*Assistant Examiner* — RuiMeng Hu
(74) *Attorney, Agent, or Firm* — F. Chau & Associates, LLC

(57) ABSTRACT

A second intercept point (IP2) calibrator and a method for calibrating IP2 are disclosed. The IP2 calibrator and the method for calibrating IP2 remove any direct current (DC) offset by comparing a common-mode reference voltage with the common-mode voltage measured between a first output terminal and a second output terminal of a mixer, and calibrates the IP2 of the mixer by comparing the common-mode voltage with a calibration reference voltage. The calibration reference voltage is independent of the common-mode reference voltage and may be a quantized variable voltage generated according to digital control code.

18 Claims, 6 Drawing Sheets

SECOND INTERCEPT POINT (IP2) CALIBRATOR AND METHOD FOR CALIBRATING IP2

CROSS-REFERENCE TO RELATED APPLICATIONS

This application claims priority, under 35 USC §119, of Korean Patent Application No. 2006-116009, filed on Nov. 22, 2006 in the Korean Intellectual Property Office (KIPO), which is incorporated by reference herein in its entirety.

BACKGROUND OF THE INVENTION

1. Field of the Invention

The present invention relates to the mixer of a direct conversion receiver, and more particularly to a second intercept point (IP2) calibrator that calibrates the IP2 of a direct conversion receiver's mixer and a method of calibrating the IP2.

2. Description of the Related Art

When radio frequency input signals having two or more input frequencies pass through non-linear systems or non-linear circuits, undesired output frequencies that are different from the input frequencies are caused by non-linearity characteristics of the systems or circuits. This phenomenon is referred to as Intermodulation Distortion (IMD). Intermodulation Distortion (IMD) represents distortion caused by "Inter-modulation" (IM) components. The IM components have frequencies corresponding to the sum of the two input frequencies and the difference between the two input frequencies. Thus, when the input signals having two different input frequencies are applied to the non-linear systems or non-linear circuits, the IMD causes interference with modulation and demodulation.

A theoretical point where a linear extension of the second order IMD intersects a linear extension of an input signal is referred to as second intercept point (IP2). The IP2 is an important parameter used to characterize the linearity of a communication system. As a power level of the input signal increases, the power level of the second order IMD also increases, and the point where the power level of the second order IMD intercepts the original power level of the input signal represents the IP2. However, since output power is saturated before the output power reaches theoretical IP2, the real IP2 corresponds to an expected hypothetical output power level where the second order IMD is expected to reach the same amplitude level as the input power level.

A third intercept point (IP3) is significant in the case of communication employing a superheterodyne architecture using an intermediate frequency (IF). A superheterodyne transmitter converts base-band signals into IF signals and converts the IF signals into radio frequency (RF) signals to transmit the RF signals. A superheterodyne receiver converts received RF signals into IF signals and converts the IF signals into base-band signals.

On the other hand, the second intercept point (IP2) is significant in the case of communication employing a direct conversion architecture that does not use IF. A direct conversion transmitter directly converts base-band signals into RF signals to transmit the RF signals. A direct conversion receiver directly converts received RF signals into base-band signals. Because second order IMD occurs at base-band frequencies, the second order IMD causes greater signal distortion than third order IMD. Accordingly, in the direct conversion architecture, there is a need for adjusting the second order IMD to prevent the signal distortion. The linearity of the communication system may increase by achieving high IP2, which reduces the second order IMD.

Generally, a mixer in the direct conversion receiver has an IP2 calibration circuit for adjusting the IP2.

FIG. 7 is a circuit diagram of a conventional IP2 calibration circuit.

Referring to FIG. 7, the conventional IP2 calibration circuit includes a mixer 10 and an IP2 controller 20. The mixer 10 includes a first pair of input terminals 2 for receiving an RF signal Vrf and a second pair of input terminals 4 for receiving a local oscillation signal Vlo corresponding to the known carrier frequency of the RF signal Vrf. The mixer 10 outputs the base-band signal having a frequency equal to the difference between the frequency of the RF signal Vrf and the frequency of the local oscillation signal Vlo. The base-band signal is outputted at a pair of output terminals 6.

The IP2 controller 20 includes load resistors RLP and RLN, and a calibration resistor Rcal. The calibration resistor Rcal is connected in parallel to the load resistor RLP as shown in FIG. 7 (or in parallel to RLN, not shown). The calibration resistor Rcal compensates for any mismatch between differential outputs Vop and Von of the mixer 10.

A total second order intermodulation (IM2) output voltage is obtained by summing up the IM2 output voltage in common-mode and the IM2 output voltage in differential-mode.

The IM2 output voltage VIM2,cm in common-mode is given by following Expression 1.

$$\text{VIM2,cm} = \text{icm}(R + \Delta R - Rc) - \text{icm}(R - \Delta R) = \text{icm}(2\Delta R - Rc),\quad \text{[Expression 1]}$$

where Rc denotes a decrease in a resistance value of the load resistor RLP due to the calibration resistor Rcal, and icm denotes a current in common-mode.

The IM2 output voltage VIM2,dm in differential-mode is given by following Expression 2.

$$\text{VIM2,dm} = \text{idm}(R + \Delta R - Rc) + \text{idm}(R - \Delta R) = \text{idm}(2R - Rc),\quad \text{[Expression 2]}$$

where Rc denotes the decrease in the resistance value of the load resistor RLP due to the calibration resistor Rcal, and idm denotes a current in the differential-mode.

Therefore, the total IM2 output voltage VIM2 is given by following Expression 3.

$$\text{VIM2} = \text{VIM2,cm} + \text{VIM2,dm} = \text{Idm}(2R - Rc) + \text{icm}(2\Delta R - Rc)\quad \text{[Expression 3]}$$

The IP2 is calibrated by adjusting the Rc to reduce the total IM2 output voltage VIM2.

The above-mentioned calibration method has limitations associated with the semiconductor manufacturing process. Since $\Delta R$ is in a range of from about 0.1% to 10% of R, Rc is also in a range of from about 0.1% to 10% of R. Additionally, Rcal needs to be ten times to thousand times as large as the resistance of R, thus, when R is tens of $K\Omega$, Rcal needs to be tens of $M\Omega$. Therefore, Rcal is difficult to be implemented in a semiconductor manufacturing process, since a considerably large resistor occupies a large area on a semiconductor substrate. Additionally, the IP2 calibration circuit using a resistive load for IP2 calibration has limitations. For example, a sufficient voltage margin may not be acquired in a structure where a high gain and linearity is required.

For overcoming such limitations, IP2 calibrators using various circuits and methods have been proposed. An IP2 calibration method calibrating a mixer by using a common-mode feedback circuit is disclosed in US Patent Application Publication No. 2006-0145706. An IP2 calibrator using the common-mode feedback circuit may be more easily implemented than the IP2 calibrator in FIG. 1.

However, DC offset may occur when IP2 of the mixer is calibrated by using the common-mode feedback circuit. Further the IP2 characteristic may be degraded when the caused DC offset is removed.

SUMMARY OF THE INVENTION

Some exemplary embodiments of the present invention provide an IP2 calibrator and a method for calibrating IP2 capable of calibrating IP2 of a mixer and removing DC offset. The IP2 calibrator and the method for calibrating IP2 remove any direct current (DC) offset by comparing a common-mode reference voltage with the common-mode voltage measured between a first output terminal and a second output terminal of a mixer, and calibrates the IP2 of the mixer by comparing the common-mode voltage with a calibration reference voltage. The calibration reference voltage is independent of the common-mode reference voltage and may be a multi-level quantized voltage generated according to a digital control code.

In some exemplary embodiments of the present invention, a second intercept point (IP2) calibrator includes a common-mode feedback circuit and an IP2 calibration circuit. The common-mode feedback circuit removes direct current (DC) offset of a mixer by comparing a common-mode reference voltage with the common-mode voltage measured between a first output terminal and a second output terminal of the mixer. The IP2 calibration circuit calibrates IP2 of the mixer by comparing the common-mode voltage with a calibration reference voltage.

In some embodiments, the IP2 calibrator may further include a calibration reference voltage generating circuit that generates the calibration reference voltage based on the common-mode voltage. The calibration reference voltage generating circuit may include a comparator and a feedback loop. The comparator compares the common-mode voltage with the calibration reference voltage. The feedback loop updates the calibration reference voltage according to an output voltage of the comparator. The calibration reference voltage generating circuit may operate in synchronization with a clock signal.

In some embodiments, the feedback loop may include a digital control code generator and a multi-level quantized voltage source. The control code generator generates a digital control code according to (e.g., by sampling) the output voltage of the comparator, and provides the digital control code. The voltage source generates the calibration reference voltage according to the digital control code provided from the control code generator. The control code generator includes a register that stores the generated digital control code.

In some embodiments, the IP2 calibration circuit may include a first feedback circuit and a second feedback circuit. The first feedback circuit changes a first load resistance of the first output terminal by comparing the common-mode voltage with the calibration reference voltage. The second feedback circuit changes a second load resistance of the second output terminal by comparing the common-mode voltage with the calibration reference voltage.

In some exemplary embodiments of the present invention, for calibrating second intercept point (IP2), direct current (DC) offset of a mixer is removed by comparing a common-mode reference voltage with the common-mode voltage measured between a first output terminal and a second output terminal of the mixer. IP2 of the mixer is calibrated by comparing the common-mode voltage with a calibration reference voltage.

In some embodiments, for calibrating IP2 of the mixer, the calibration reference voltage is generated based on the common-mode voltage.

In some embodiments, for generating the calibration reference voltage, the common-mode voltage is compared with the calibration reference voltage. Additionally, the calibration reference voltage may be periodically updated according to a result of the comparison.

In some embodiments, for updating the calibration reference voltage, a digital control code is generated according to the result of the comparison. Additionally, the calibration reference voltage is generated according to the digital control code.

In some embodiments, for calibrating IP2 of the mixer, a load resistance of the first output terminal is changed by comparing the common-mode voltage with the calibration reference voltage. Additionally, a load resistance of the second output terminal is changed by comparing the common-mode voltage with the calibration reference voltage.

Therefore, an IP2 calibration and a removal of a DC offset of a mixer may be efficiently performed by using a common-mode feedback circuit according to an exemplary embodiment of the present invention.

Embodiments of the present invention now will be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion. The terminology used herein is for the purpose of describing particular embodiments and is not intended to be limiting of the invention. As used herein, the singular forms "a," "an" and "the" are intended to include the plural forms as well, unless the context clearly indicates otherwise.

DETAILED DESCRIPTION OF EXEMPLARY EMBODIMENTS OF THE INVENTION

Figure 1:
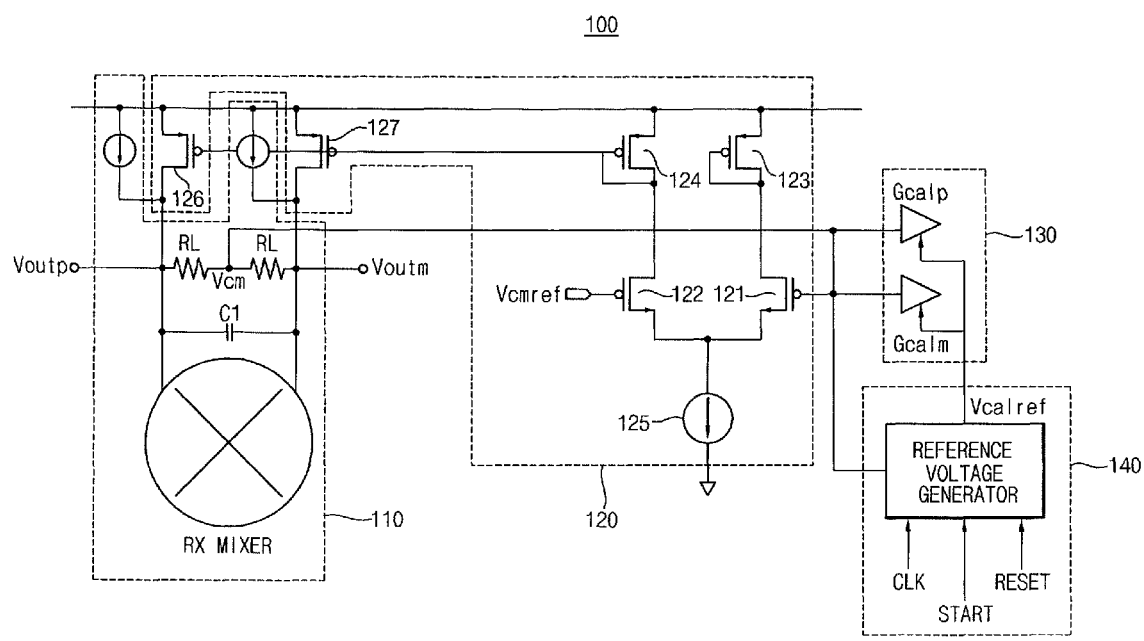
FIG. 1 is a circuit diagram of a second intercept point (IP2) calibrator according to an exemplary embodiment of the present invention.

FIG. 1 is a circuit diagram of a second intercept point (IP2) calibrator 100 according to an exemplary embodiment of the present invention.

The IP2 calibrator 100 removes the direct current (DC) offset of a mixer 110 by comparing a common-mode voltage Vcm with a common-mode reference voltage Vcmref, and calibrates the IP2 of the mixer 110 by comparing the common-mode voltage with a calibration reference voltage Vcalref.

The IP2 calibrator 100 includes a common-mode feedback circuit 120 for removing the DC offset of the mixer 110, and a IP2 calibration circuit 130 for calibrating the IP2 of the mixer 110. The common-mode feedback circuit 120 removes the DC offset of the mixer 110 by comparing the common-mode voltage Vcm measured between first and second output terminals Voutp and Voutm with the common-mode reference voltage Vcmref. The IP2 calibration circuit 130 calibrates the IP2 of the mixer 110 by comparing the common-mode voltage with a calibration reference voltage Vcalref.

The common-mode feedback circuit 120 includes a current source 125, first and second n-type metal oxide semiconductor (NMOS) transistors 121 and 122, first and second p-type metal oxide semiconductor (PMOS) transistors 123 and 124, and first and second common-mode feedback PMOS transistors 126 and 127. The current source 125 provides a bias current. The first NMOS transistor 121 has its gate receiving the common-mode voltage Vcm, and its source connected to the current source 125. The second NMOS transistor 122 has its gate receiving the common-mode reference voltage Vcmref, and its source connected to the current source 125. The first PMOS transistor 123 has its gate and its drain commonly connected to the drain of the first NMOS transistor 121, and its source connected to a power supply voltage. The second PMOS transistor 124 that has its gate and its drain commonly connected to the drain of the second NMOS transistor 122, and its source connected to the power supply voltage. The first common-mode feedback PMOS transistor 126 constitutes a current mirror with the second PMOS transistor 124. Additionally, the first common-mode feedback PMOS transistor 126 has its drain connected to the first output terminal Voutp, and its source connected to the power supply voltage. The second common-mode feedback PMOS transistor 127 constitutes a current mirror with the second PMOS transistor 124. Additionally, the second common-mode feedback PMOS transistor 127 has its drain connected to the second output terminal Voutm, and its source connected to the power supply voltage.

Hereinafter, an operation of the common-mode feedback circuit 120 will be described.

The current flowing through the first NMOS transistor 121 is greater than the current flowing through the second NMOS transistor 122 when the common-mode voltage Vcm is greater than the common-mode reference voltage Vcmref. In this case, the voltage at the gate of the second PMOS transistor 124 rises, and voltages at the gates of the first and second common-mode feedback PMOS transistors 126 and 127 also rise. The source-drain resistance through each of the first and second common-mode feedback PMOS transistors 126 and 127 increases when the voltages at the gates of the first and second common-mode feedback PMOS transistors 126 and 127 rise. Thus, voltages at the first and second output terminals Voutp and Voutm decrease. The common mode voltage Vcm is an average value measured between the first and second output terminals Voutp and Voutm, and thus the common-mode voltage Vcm decreases.

On the other hand, when the common-mode voltage Vcm is less than the common-mode reference voltage Vcmref, the current flowing through the first NMOS transistor 121 is less than the current flowing through the second NMOS transistor 122. In this case, the voltage at the gate of the second PMOS transistor 124 falls, and the voltages at the gates of the first and second common-mode feedback PMOS transistors 126 and 127 also fall. The source-drain resistance through each of the first and second common-mode feedback PMOS transistors 126 and 127 decrease when the voltages at the gates of the first and second common-mode feedback PMOS transistors 126 and 127 fall. Accordingly, the voltages at the first and second output terminals Voutp and Voutm increase. The common mode voltage Vcm is the average value measured between the first and second output terminals Voutp and Voutm, and thus the common-mode voltage Vcm increases.

As such, the common-mode voltage Vcm may follow the common-mode reference voltage Vcmref by the common-mode feedback circuit 120. Although the common-mode voltage Vcm rises or falls when the DC offset occurs, the common-mode feedback circuit 120 removes the DC offset by feedback operation.

The IP2 calibration circuit 130 calibrates the IP2 of the mixer by changing the load resistances of the first and second output terminals Voutp and Voutm by comparing the common-mode voltage Vcm with the calibration reference voltage Vcalref. The IP2 calibration circuit 130 includes two feedback circuits for performing the calibration. The operation of the IP2 calibration circuit 130 will be described in greater detail below with reference to FIG. 3.

The IP2 calibrator 100 may further include a reference voltage generator 140 that generates the calibration reference voltage Vcalref. The reference voltage generator 140 receives the common-mode voltage Vcm, and the reference voltage generator 140 updates the calibration reference voltage Vcalref synchronously with a clock signal CLK. The operation of the reference voltage generator 140 will now be described in greater detail with reference to FIG. 2.

Figure 2:
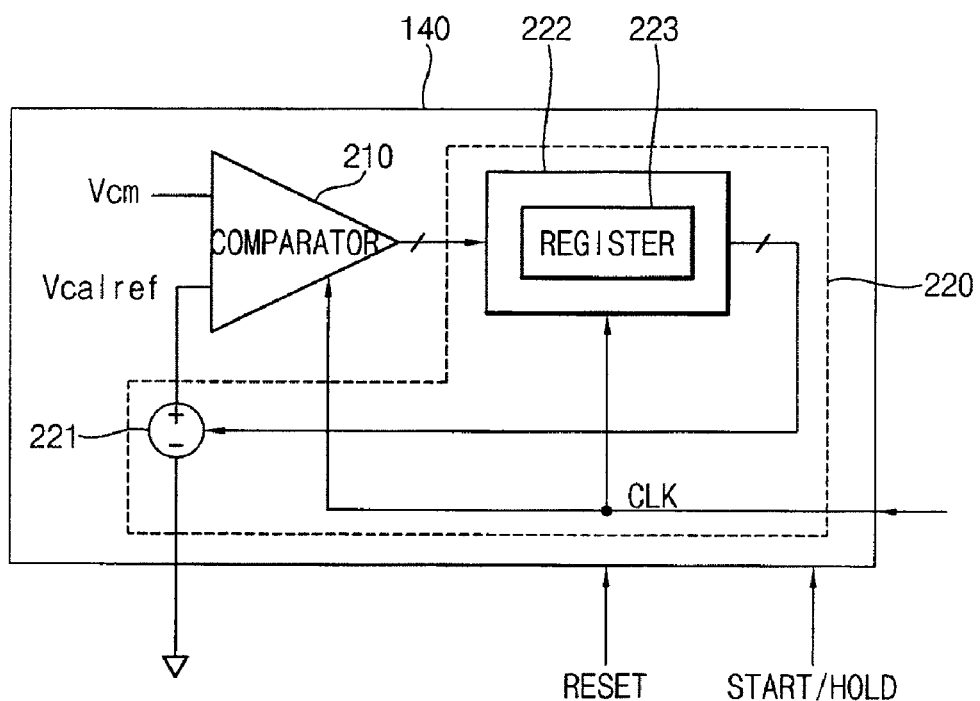
FIG. 2 is a circuit diagram of a reference voltage generator 140 in the IP2 calibrator of FIG. 1.

FIG. 2 is a circuit diagram of a reference voltage generator 140 in the IP2 calibrator of FIG. 1.

The reference voltage generator 140 receives the common-mode voltage Vcm and generates therefrom the calibration reference voltage Vcalref. The reference voltage generator 140 compares the common-mode voltage Vcm with the calibration reference voltage Vcalref, and updates the calibration reference voltage Vcalref according to the result of the comparison.

The reference voltage generator 140 includes a comparator 210 that compares the common-mode voltage Vcm with the calibration reference voltage Vcalref, and a feedback loop 220 that updates the calibration reference voltage Vcalref according to an output of the comparator 210.

The reference voltage generator 140 maintains its reset state while the mixer is turned OFF, and updates the calibration reference voltage Vcalref when the mixer is turned ON. The reference voltage generator 140 maintains the calibration reference voltage Vcalref when the calibration reference voltage Vcalref reaches a reference voltage. The reference voltage generator 140 generates the calibration reference voltage Vcalref synchronously with the clock signal CLK.

The feedback loop 220 generates a digital control code according to the result of the comparison, and generates calibration reference voltage Vcalref corresponding to the digital control code.

The feedback loop 220 includes a control code generator 222 that generates the digital control code according to the output of the comparator 210, and a voltage source 221 that generates the calibration reference voltage Vcalref corresponding to the digital control code.

The control code generator 222 includes a register 223 that stores the digital control code as a plurality of bits of data, and the control code generator 222 repeatedly updates the digital control code stored in the register 223 according to the output of the comparator 210. An active hold signal HOLD is provided to the control code generator 222 when the calibration reference voltage Vcalref reaches the reference voltage, and the control code generator 222 maintains the digital control code stored in the register 223 in response to the active hold signal HOLD.

Figure 3:
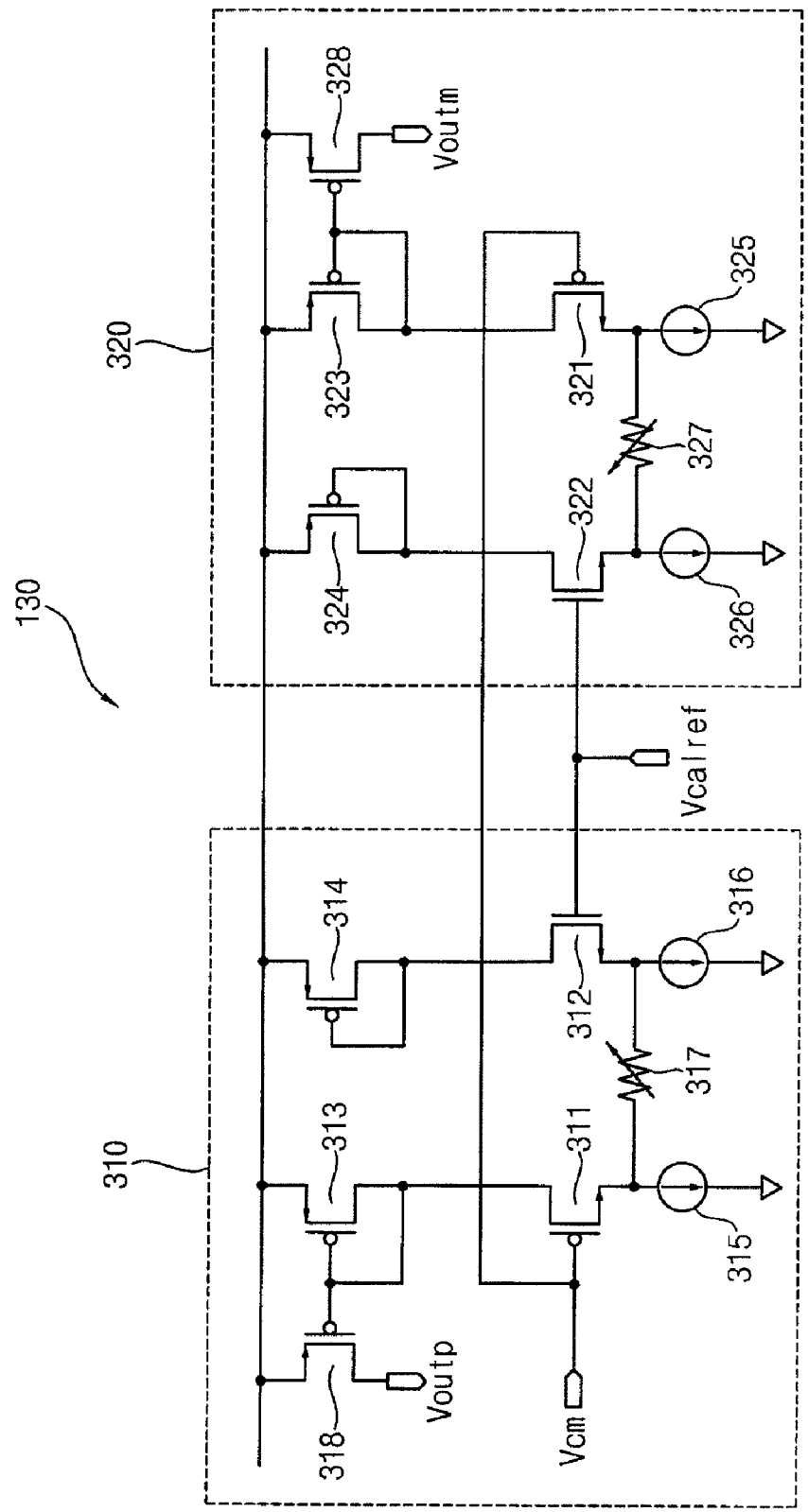
FIG. 3 is a circuit diagram of an IP2 calibration circuit 130 in the IP2 calibrator of FIG. 1.

FIG. 3 is a circuit diagram of an IP2 calibration circuit in the IP2 calibrator of FIG. 1.

The IP2 calibration circuit 130 compares the common-mode voltage Vcm with the calibration reference voltage Vcalref to change the resistances of the first and second output terminals Voutp and Voutm in response to a result of the comparison.

The IP2 calibration circuit 130 includes a first feedback circuit 310 that changes the load resistance of the first output terminal Voutp, and a second feedback circuit 320 that changes the load resistance of the second output terminal Voutm.

The first feedback circuit 310 includes first and second current sources 315 and 316, first and second NMOS transistors 311 and 312, a first variable resistance 317, first and second PMOS transistors 313 and 314, and a first calibration PMOS transistor 318. The first and second current sources 315 and 316 provide bias currents. The first NMOS transistor 311 has its gate receiving the common-mode voltage Vcm, and its source connected to the first current source 315. The second NMOS transistor 312 has its gate receiving the calibration reference voltage Vcalref, and its source connected to the second current source 316. The first variable resistance 317 is connected between the source of the first NMOS transistor 311 and the source of the second NMOS transistor 312. The first PMOS transistor 313 has its gate and its drain commonly connected to the drain of the first NMOS transistor 311. The source of the first PMOS transistor 313 is connected to the power supply voltage. The second PMOS transistor 314 has its gate and its drain commonly connected to the drain of the second NMOS transistor 312. The source of the second PMOS transistor 314 is connected to the power supply voltage. The first calibration PMOS transistor 318 constitutes a current mirror with the first PMOS transistor 313, and the first calibration PMOS transistor 318 has its drain connected to the first output terminal Voutp.

The second feedback circuit 320 includes third and fourth current sources 325 and 326, third and fourth NMOS transistors 321 and 322, second variable resistance 327, third and fourth PMOS transistors 323 and 324, and a second calibration PMOS transistor 328. The third and fourth current sources 325 and 326 provide bias currents. The third NMOS transistor 321 has its gate receiving the common-mode voltage Vcm, and its source connected to the third current source 325. The fourth NMOS transistor 322 has its gate receiving the calibration reference voltage Vcalref, and its source connected to the fourth current source 316. The second variable resistance 327 is connected between the source of the third NMOS transistor 321 and the source of the fourth NMOS transistor 322. The third PMOS transistor 323 has its gate and its drain commonly connected to the drain of the third NMOS transistor 321. The source of the third PMOS transistor 323 is connected to the power supply voltage. The fourth PMOS transistor 324 has its gate and its drain commonly connected to the drain of the fourth NMOS transistor 322. The source of the fourth PMOS transistor 324 is connected to the power supply voltage. The second calibration PMOS transistor 328 constitutes a current mirror with the third PMOS transistor 323, and the second calibration PMOS transistor 328 has its drain connected to the second output terminal Voutm.

The first feedback circuit 310 and the second feedback circuit 320 change the load resistances of the first and second output terminals Voutp and Voutm by a voltage feedback of the common-mode voltage Vcm. Operations of the first feedback circuit 310 and the second feedback circuit 320 may be same as an operation of the common-mode feedback circuit 120 illustrated in FIG. 1.

Meanwhile, the respective gains of the first feedback circuit 310 and the second feedback circuit 320 may be changed by adjusting the first and second variable resistances 317 and 327. A difference between the gains of the first feedback circuit 310 and the second feedback circuit 320 is used for calibrating IP2 of the mixer.

Hereinafter, there will be an explanation of a reason for using the calibration reference voltage Vcalref instead of the common-mode voltage Vcm in the IP2 calibration circuit.

The gates of the second and fourth NMOS transistors 312 and 322 are assumed to receive the common-mode reference voltage Vcmref instead of the calibration reference voltage Vcalref.

Figure 4:
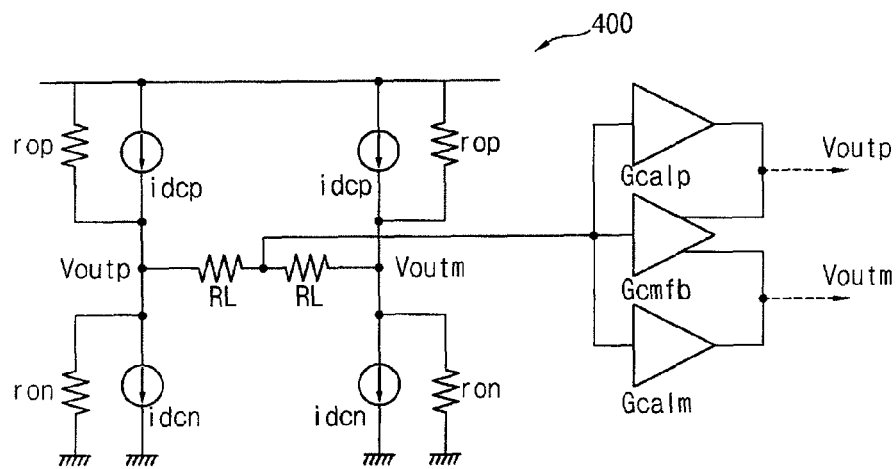
FIG. 4 is a first small-signal model circuit diagram 400 of the IP2 calibration circuit 130 of FIG. 3.
Figure 5:
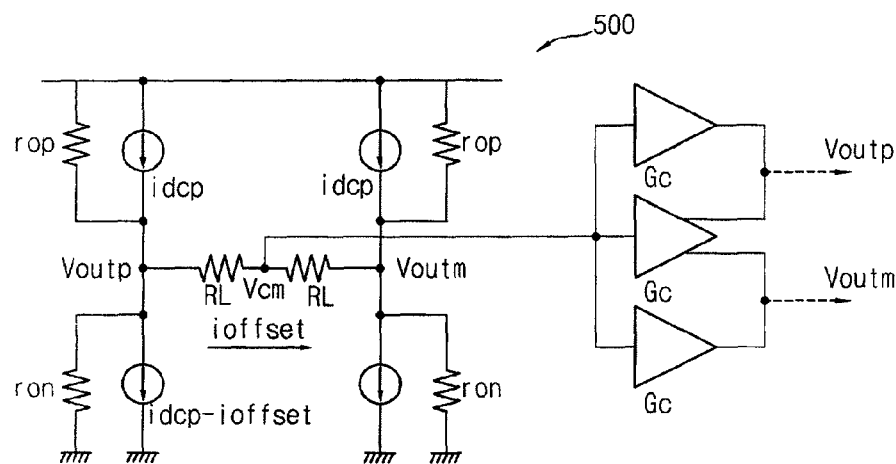
FIG. 5 is a second small-signal model circuit diagram 500 of the IP2 calibration circuit 130 of FIG. 3 for illustrating an imbalance of the mixer denoted by an offset current ioffset.
Figure 6:
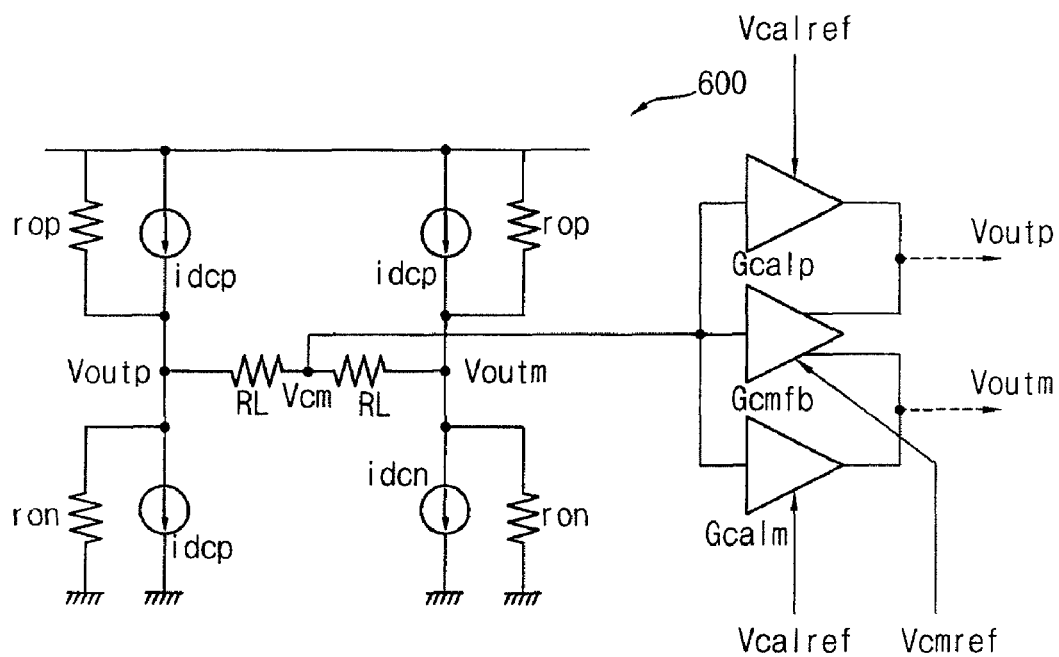
FIG. 6 is a third small-signal model circuit diagram 600 of the IP2 calibration circuit 130 of FIG. 3 for explaining the operation of the IP2 calibrator 100 of FIG. 1.
Figure 7:
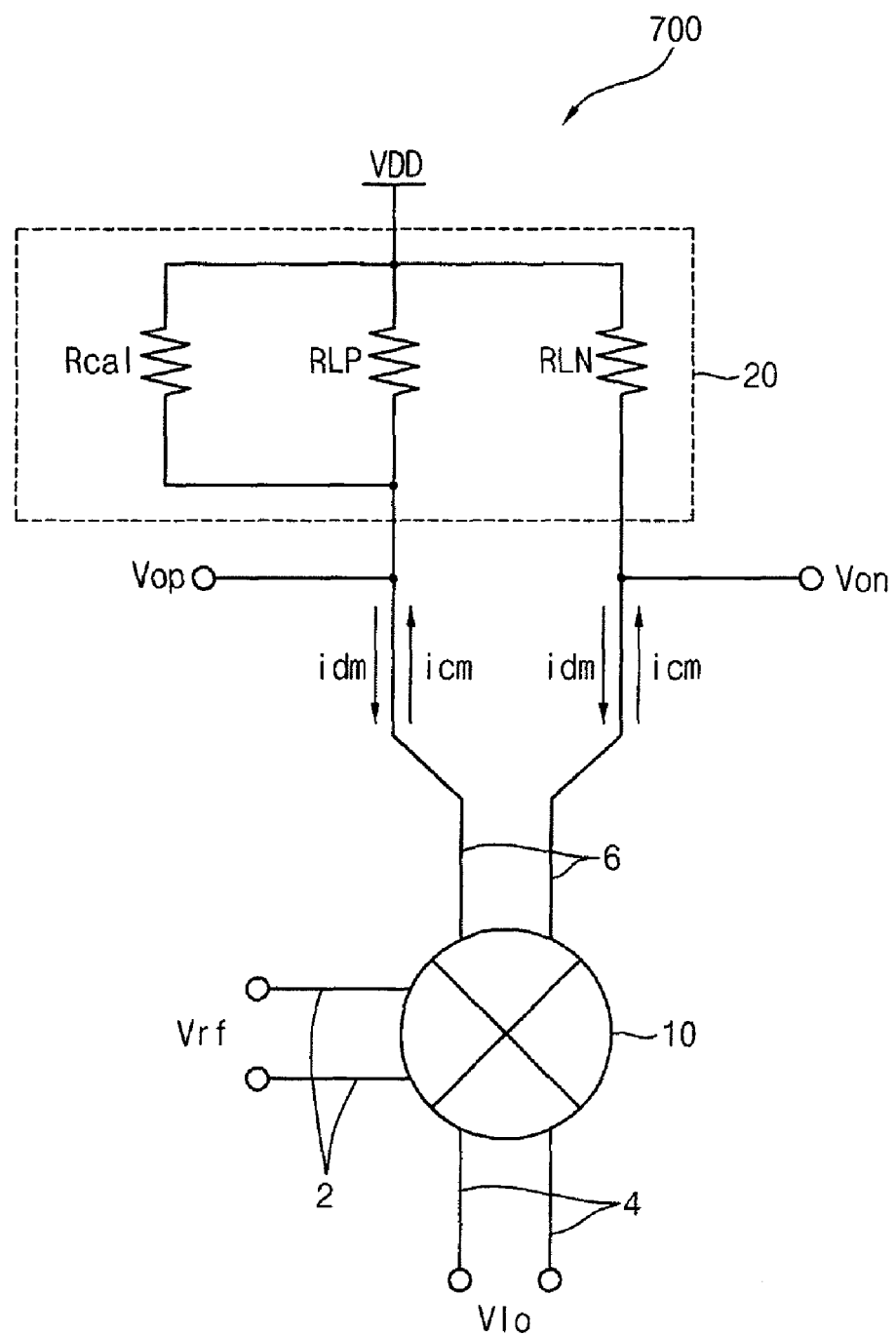
FIG. 7 is a circuit diagram of a conventional IP2 calibration circuit.

FIGS. 4 through 6 are signal model equivalent circuit diagrams for explaining development background and operation of the IP2 calibrator 100 of FIG. 1. FIG. 4 illustrates a small signal model 400 of the IP2 calibration circuit 130 of FIG. 3. Small signal modeling is a common analysis method used in electrical engineering to describe nonlinear devices in terms of linear equations.

Here, an output voltage of the IP calibration circuit 130 is given by the following Expression 4.

$$V_{IM2,CM} = \frac{1}{G_L} \frac{Gcalp - Gcalm}{2Gcmfb + Gcalp + Gcalm - 2g_o} i_{IM2,CM} \quad \text{[Expression 4]}$$

$$V_{IM2,DM} = \frac{1}{G_L} i_{IM2,DM}$$

where $$g_o = \frac{1}{r_{op}} + \frac{1}{r_{on}} \text{ and } G_L = \frac{1}{R_L} + \frac{1}{r_{op}} + \frac{1}{r_{on}}$$

In Expression 4, VIM2, CM is the output voltage of the IP calibration circuit 130 calculated in common-mode, and VIM2,DM is the output voltage of the IP calibration circuit 130 calculated in differential-mode. iIM2,CM denotes a common-mode current, and iIM2,DM denotes a differential-mode current.

A resistance difference between the first and second output terminals Voutp and Voutm is given by the following Expression 5.

$$\Delta R_L = \frac{1}{G_L} \frac{Gcalp - Gcalm}{2Gcmfb + Gcalp + Gcalm - 2g_o} \quad \text{[Expression 5]}$$

In Expression 5, Gcalp and Gcalm respectively denote transconductances of equivalent circuits of the first feedback circuit 310 and the second feedback circuit 320 in FIG. 3, and Gcmfb denotes a transconductance of an equivalent circuit of the common-mode feedback circuit 120 in FIG. 1.

Gcalp and Gcalm may be represented as follows $$G_{calp} = G_{cal} + \Delta G_{cal}, \quad G_{calm} = G_{cal} - \Delta G_{cal}$$

Thus, the resistance difference between the first and second output terminals Voutp and Voutm may be expressed by the following Expression 6.

$$\Delta R_L = \frac{1}{G_L} \frac{2\Delta G_{cal}}{2G_{cmfb} + 2G_{cal} - 2g_o} = \frac{1}{G_L} \frac{\Delta G_{cal}}{G_{cmfb} + G_{cal} - g_o} \quad \text{[Expression 6]}$$

The gain difference between the first feedback circuit 310 and the second feedback circuit 320 increases and a gain of the common-mode feedback circuit decreases with an increase in the resistance difference between the first and second output terminals Voutp and Voutm. The resistance difference between the first and second output terminals Voutp and Voutm in Expression 6 may denote a calibration range.

Therefore, an imbalance of loads (the load resistance of the first output terminal and the load resistance of the second output terminal) of the mixer may be calibrated as given in Expression 6. However, the expression 6 formulated is based on an assumed premise that the current biases of the mixer in FIG. 4 are stable. In practice, a differential-mode DC offset occurs when the IP2 of the mixer is calibrated. How the differential-mode DC offset occurs will be described with reference to FIG. 5.

FIG. 5 is a small-signal model circuit diagram 400 of the IP2 calibration circuit 130 of FIG. 3 for illustrating imbalance of the mixer denoted by an offset current ioffset.

When the imbalance exists, the common-mode voltage Vcm is not identical to the common-mode reference voltage Vcmref despite using the common-mode feedback circuit 120.

Now, in the small-signal model of FIG. 5, a relationship between the common-mode voltage Vcm and the common-mode reference voltage Vcm_ref is given by the following Expression 7.

$$V_{CM} = \frac{i_{offset}}{G_{cmfb} - g_o} + V_{CM\_REF} \quad \text{[Expression 7]}$$

When the difference between the common-mode voltage Vcm and the common-mode reference voltage Vcmref is defined as a common voltage offset Vcmoffset, the common voltage offset Vcmoffset is given by the Expression 8.

$$V_{CM\,offset} = \frac{i_{offset}}{G_{cmfb} - g_o} \quad \text{[Expression 8]}$$

Output currents of the first and second feedback circuits 310 and 320 are defined as Expression 9.

$$I_{calm\_out} = V_{CMoffset} G_{calm}$$

$$I_{calp\_out} = V_{CMoffset} G_{calp} \quad \text{[Expression 9]}$$

The difference current Icaloffset representing the difference between output currents of the first and second feedback circuits 310 and 320 is given by the following Expression 10.

$$I_{caloffset} = I_{calpout} - I_{calmout} = V_{CMoffset}(G_{calp} - G_{calm}) \quad \text{[Expression 10]}$$

Expression 11 is a rearrangement of Expression 10.

$$I_{caloffset} = V_{CMoffset} \Delta G_{cal} = \frac{I_{offset}}{G_{cmfb}} \Delta G_{cal} \quad \text{[Expression 11]}$$

As represented by Expression 11, the difference between the output currents of the first and second feedback circuits Icaloffset is proportional to the difference of the gains of the first and second feedback circuits 310 and 320, and is inversely proportional to the gain of the common-mode feedback circuit 120. Therefore, the gains of the first and second feedback circuits 310 and 320 must decrease and the gain of the common-mode feedback circuit 120 must increase with a reduction of the difference between the output currents of the first and second feedback circuits Icaloffset, thus reducing an effect of the offset current ioffset.

However, the gains of the first and second feedback circuits 310 and 320 must increase and the gain of the common-mode feedback circuit 120 must decrease for extending the calibration range according to Expression 6.

The differential-mode DC offset may occur when an IP2 characteristic is improved, and the IP2 characteristic of the mixer may be worse when the differential-mode DC offset is removed.

For solving such problems, reference voltages of the common-mode feedback circuit 120 and the IP2 calibration circuit 130 are set to be different in the IP2 calibrator 100 of FIG. 1.

Referring to a small signal model 600 in FIG. 6 of the IP2 calibration circuit 130 of FIG. 3, the common-mode reference voltage Vcmref is applied to the common-mode feedback circuit 120 as the reference voltage. However, the calibration reference voltage Vcalref is applied to the first and second feedback circuits 310 and 320 included in the IP2 calibration circuit 130. The common-mode reference voltage Vcmref is independent of the calibration reference voltage Vcalref.

Accordingly, the common-mode voltage Vcm may closely follow the common-mode reference voltage Vcmref, and the IP2 characteristic of the mixer may be improved using the IP2 calibration circuit 130.

As mentioned above, the IP2 calibrator 100 and the method for calibrating the IP2 of the mixer may calibrate the IP2 and may remove the differential-mode DC offset.

The IP2 calibrator 100 and the method for calibrating the IP2 use different reference voltages in contrast to the single reference voltage in a conventional IP2 calibrator 700 using a conventional common mode feedback method. The different reference voltages are the common-mode reference voltage Vcmref of the common-mode feedback circuit for removing the common-mode DC offset and the calibration reference voltage Vcalref of the IP2 calibration circuit for calibrating IP2. Thus, the IP2 calibrator 100 and the method for calibrating the IP2 according to exemplary embodiments of the present invention may efficiently remove the differential-mode DC offset and calibrate the IP2.

While the exemplary embodiments of the present invention and their features have been described in detail, it should be understood that various changes, substitutions and alterations may be made herein without departing from the scope of the invention.

What is claimed is:

1. A second intercept point (IP2) calibrator, comprising: a common-mode feedback circuit configured to remove direct current (DC) offset of a mixer by comparing a common-mode reference voltage with the common-mode voltage measured between a first output terminal and a second output terminal of the mixer; an IP2 calibration circuit configured to calibrate IP2 of the mixer by comparing the measured common-mode voltage with a calibration reference voltage, and a calibration reference voltage generating circuit configured to generate the calibration reference voltage based upon the comparison of the measured common-mode voltage with the calibration reference voltage.

2. The IP2 calibrator of claim 1, wherein the calibration reference voltage generating circuit comprises:
 a comparator configured to compare the common-mode voltage with the calibration reference voltage; and
 a feedback loop configured to update the calibration reference voltage according to an output voltage of the comparator.

3. The IP2 calibrator of claim 2, wherein the calibration reference voltage generating circuit operates in synchronization with a clock signal.

4. The IP2 calibrator of claim 3, wherein the feedback loop comprises:
 a control code generator that generates a digital control code according to the output voltage of the comparator; and
 a variable voltage source that generates the calibration reference voltage according to the digital control code output from the control code generator.

5. The IP2 calibrator of claim 4, wherein the control code generator comprises a register that stores the generated digital control code.

6. The IP2 calibrator of claim 1, wherein the IP2 calibration circuit comprises:
 a first feedback circuit configured to change a first load resistance of the first output terminal by comparing the common-mode voltage with the calibration reference voltage; and
 a second feedback circuit configured to change a second load resistance of the second output terminal by comparing the common-mode voltage with the calibration reference voltage.

7. The IP2 calibrator of claim 6, wherein the first feedback circuit comprises:
 a first current source;
 a second current source;
 a first n-type metal oxide semiconductor (NMOS) transistor that has its gate receiving the common-mode voltage, and its source connected to the first current source;
 a second NMOS transistor that has its gate receiving the calibration reference voltage, and its source connected to the second current source;
 a first variable resistance connected between the first NMOS transistor and the second NMOS transistor;
 a first p-type metal oxide semiconductor (PMOS) transistor that has its gate and its drain commonly connected to the drain of the first NMOS transistor, and its source connected to a power supply voltage;
 a second PMOS transistor that has its gate and its drain commonly connected to the drain of the second NMOS transistor, and its source connected to the power supply voltage; and
 a first calibration PMOS transistor that has its drain connected to the first output terminal, the first calibration PMOS transistor forming a current-mirror configuration with the first PMOS transistor.

8. The IP2 calibrator of claim 6, wherein the second feedback circuit comprises:
 a third current source;
 a fourth current source;
 a third NMOS transistor that has its gate receiving the common-mode voltage, and its source connected to the third current source;
 a fourth NMOS transistor that has its gate receiving the calibration reference voltage, and its source connected to the fourth current source;
 a second variable resistance connected between the third NMOS transistor and the fourth NMOS transistor;
 a third PMOS transistor that has its gate and its drain commonly connected to the drain of the third NMOS transistor, and its source connected to the power supply voltage;
 a fourth PMOS transistor that has its gate and its drain commonly connected to the drain of the fourth NMOS transistor, and its source connected to the power supply voltage; and
 a second calibration PMOS transistor that has its drain connected to the second output terminal, the second calibration PMOS transistor having a current-mirror configuration with respect to the first PMOS transistor, and
 wherein the second calibration PMOS transistor that has its drain connected to the second output terminal, the second calibration PMOS transistor forming a current-mirror configuration with the third PMOS transistor.

9. The IP2 calibrator of claim 1, wherein the common-mode feedback circuit comprises:
 a fifth current source;
 a fifth NMOS transistor that has its gate receiving the common-mode voltage, and its source connected to the fifth current source;
 a sixth NMOS transistor that has its gate receiving the common-mode reference voltage, and its source connected to the fifth current source;
 a fifth PMOS transistor that has its gate and its drain commonly connected to the drain of the fifth NMOS transistor, and its source connected to a power supply voltage;
 a sixth PMOS transistor that has its gate and its drain commonly connected to the drain of the sixth NMOS transistor, and its source connected to the power supply voltage;
 a first common-mode feedback PMOS transistor that has its drain connected to the first output terminal, the first common-mode feedback PMOS transistor forming a current-mirror configuration with the sixth NMOS transistor; and
 a second common-mode feedback PMOS transistor that has its drain connected to the second output terminal, the second common-mode feedback PMOS transistor forming a current-mirror configuration with the sixth PMOS transistor.

10. A method of calibrating second intercept point (IP2) of a mixer of a direct conversion receiver, the method comprising: removing direct current (DC) offset of the mixer by comparing a common-mode reference voltage with the common-mode voltage measured between a first output terminal and a second output terminal of the mixer; generating a calibration reference voltage based upon the comparison of the measured common-mode voltage with the calibration reference voltage; and calibrating IP2 of the mixer by comparing the measured common-mode voltage with the calibration reference voltage.

11. The method of claim 10, wherein generating the calibration reference voltage comprises:
comparing the common-mode voltage with the calibration reference voltage; and
updating the calibration reference voltage according to a result of the comparison.

12. The method of claim 11, wherein updating the calibration reference voltage comprises:
generating a digital control code according to the result of the comparison; and
generating the calibration reference voltage according to the digital control code.

13. The method of claim 10, wherein calibrating IP2 of the mixer comprises:
changing a load resistance of the first output terminal by comparing the common-mode voltage with the calibration reference voltage; and
changing a load resistance of the second output terminal by comparing the common-mode voltage with the calibration reference voltage.

14. A second intercept point (IP2) calibrator, comprising: a common-mode feedback circuit configured to remove direct current (DC) offset of a mixer by comparing a common-mode reference voltage with a common-mode voltage measured between a first output terminal and a second output terminal of the mixer; an IP2 calibration circuit configured to calibrate IP2 of the mixer in a direct conversion unit by comparing the measured common-mode voltage with a calibration reference voltage; and a variable voltage source configured to generate the calibration reference voltage based upon the comparison of the measured common-mode voltage with the calibration reference voltage according to a digital control code output from a digital control code generator.

15. The IP2 calibrator of claim 14, further comprising:
a control code generator that generates a digital control code according to the output voltage of a comparator;
wherein the comparator compares the calibration reference voltage with the common-mode voltage measured between a first output terminal and a second output terminal of the mixer.

16. The IP2 calibrator of claim 15, wherein the comparator operates in synchronization with a clock signal.

17. The IP2 calibrator of claim 14, further comprising:
a comparator; and
a feedback loop configured to update the calibration reference voltage according to an output voltage of the comparator.

18. The IP2 calibrator of claim 15, wherein the control code generator comprises a register that stores the generated digital control code.

* * * * *